United States Patent
Collier et al.

(10) Patent No.: US 8,580,656 B2
(45) Date of Patent: Nov. 12, 2013

(54) PROCESS FOR INHIBITING CORROSION AND REMOVING CONTAMINANT FROM A SURFACE DURING WAFER DICING AND COMPOSITION USEFUL THEREFOR

(75) Inventors: Terence Quintin Collier, Rowlett, TX (US); Charles A. Lhota, San Antonio, TX (US); David Barry Rennie, Bethlehem, PA (US); Rajkumar Ramamurthi, Cave Creek, AZ (US); Madhukar Bhaskara Rao, Fogelsville, PA (US); Dnyanesh Chandrakant Tamboli, Breinigsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 115 days.

(21) Appl. No.: 12/499,556

(22) Filed: Jul. 8, 2009

(65) Prior Publication Data

US 2010/0009517 A1 Jan. 14, 2010

Related U.S. Application Data

(60) Provisional application No. 61/080,474, filed on Jul. 14, 2008.

(51) Int. Cl.
*H01L 21/00* (2006.01)
*H01L 21/44* (2006.01)
*C03C 15/00* (2006.01)
*C03C 25/68* (2006.01)
*C09K 13/00* (2006.01)

(52) U.S. Cl.
USPC ............. 438/460; 438/612; 438/113; 216/83; 252/79.1; 257/E21.599

(58) Field of Classification Search
None
See application file for complete search history.

(56) References Cited

U.S. PATENT DOCUMENTS

| | | | |
|---|---|---|---|
| 5,461,008 | A | 10/1995 | Sutherland et al. |
| 5,466,389 | A | 11/1995 | Ilardi et al. |
| 6,383,991 | B1 | 5/2002 | Hashimoto et al. |
| 6,673,754 | B1 | 1/2004 | Nabeshima et al. |
| 6,730,644 | B1 | 5/2004 | Ishikawa et al. |
| 7,188,630 | B2 | 3/2007 | Flake et al. |

(Continued)

FOREIGN PATENT DOCUMENTS

| | | |
|---|---|---|
| CN | 1271000 A | 10/2000 |
| CN | 1405287 A | 3/2003 |

(Continued)

OTHER PUBLICATIONS

Duan, S., et al.; "Al Pad Corrosion Mechanism Study when Dicing Saw"; Proceedings of the 33rd Int'l Symposium for Testing and Failure Analysis; Nov. 4-8, 2007; McEnery Convention Center, San Jose, CA; pp. 121-125.

(Continued)

*Primary Examiner* — Nadine Norton
*Assistant Examiner* — Stephanie Duclair
(74) *Attorney, Agent, or Firm* — Lina Yang

(57) ABSTRACT

Adherence of contaminant residues or particles is suppressed, corrosion of exposed surfaces is substantially reduced or eliminated during the process of dicing a wafer by sawing. A fluoride-free aqueous composition comprising a dicarboxylic acid and/or salt thereof; a hydroxycarboxylic acid and/or salt thereof or amine group containing acid, a surfactant and deionized water is employed.

9 Claims, 10 Drawing Sheets

(56) References Cited

U.S. PATENT DOCUMENTS

| | | |
|---|---|---|
| 7,541,322 B2 | 6/2009 | Ikemoto et al. |
| 2003/0096500 A1* | 5/2003 | Kneer ............................ 438/687 |
| 2004/0035354 A1 | 2/2004 | Kneer |
| 2004/0209443 A1 | 10/2004 | Cadieux et al. |
| 2005/0009714 A1 | 1/2005 | Chen et al. |
| 2005/0205835 A1* | 9/2005 | Tamboli et al. .............. 252/79.1 |
| 2006/0270573 A1 | 11/2006 | Ikemoto et al. |
| 2007/0010406 A1 | 1/2007 | Okamoto et al. |
| 2007/0099807 A1* | 5/2007 | Smith et al. .................... 510/180 |
| 2008/0173328 A1 | 7/2008 | Nishiwaki |
| 2010/0009517 A1 | 1/2010 | Collier et al. |

FOREIGN PATENT DOCUMENTS

| | | |
|---|---|---|
| CN | 1918698 A | 2/2007 |
| CN | 101085541 A | 12/2007 |
| CN | 101205498 A | 6/2008 |
| EP | 1 577 934 A1 | 9/2005 |
| EP | 1577934 A1 | 9/2005 |
| EP | 1 715 510 A1 | 10/2006 |
| EP | 1808480 | 10/2009 |
| JP | 55-4980 A | 1/1980 |
| JP | 60-38871 B2 | 9/1985 |
| JP | 07-297158 | 11/1995 |
| JP | 2005-179630 A | 7/2005 |
| JP | 2009-013301 A | 1/2009 |
| KR | 2006-0127098 | 12/2006 |
| KR | 2008-0023662 A | 3/2008 |
| WO | 02/065538 A2 | 8/2002 |
| WO | 2007037628 | 5/2007 |

OTHER PUBLICATIONS

Younan, H., et al.; "Studies of Silicon Dust Corrosion on Microchip Al Bondpads and Elimination of Silicon Dust During Wafer Sawing Process"; Proceedings of the 32nd Int'l Symposium for Testing and Failure Analysis; Nov. 12-16, 2006; Penaissance Austin Hotel, Austin, TX; pp. 300-304.

Hua, Y.N., et al.; "Failure Analysis and Elimination of Galvanic Corrosion on Bondpads During Wafer Sawing"; Proceeding from the 26th International Symposium for Testing and Failure Analysis; Nov. 12-16, 2000; Bellevue, Washington; pp. 369-372.

Keteca Diamaflow Dicing Solutions & Surfactants, Keteca Singapore (Pte) Ltd.'s website, 2006.

\* cited by examiner

Aluminum Blanket Wafers

DIW  B 1000:1

Copper Blanket Wafers

PROCESS FOR INHIBITING CORROSION AND REMOVING CONTAMINANT FROM A SURFACE DURING WAFER DICING AND COMPOSITION USEFUL THEREFOR

CROSS-REFERENCE TO RELATED APPLICATIONS

This application claims benefit of U.S. Provisional Application No. 61/080,474, filed Jul. 14, 2008. The disclosure of this provisional application is hereby incorporated by reference.

BACKGROUND OF THE INVENTION

The integrated circuits are usually formed on a wafer. A single wafer contains plurality of integrated circuit chips, or dies. An integrated circuit chip or dice, is obtained through a dicing process of sawing the wafer.

During the dicing process, small contaminant residues/particles from sawing the wafer, usually silicon residue, adhere to wafer surface, accumulate in bonding pads and trenched locations. They are difficult to remove in subsequent cleaning processes once in contact with wafer and virtually impossible to remove once trapped in deep trenches. In addition, during the dicing process, the bonding pads are exposed for corrosion to occur. Corrosion can damage the bonding pads leading to poor bonding performance, poor reliability, or even failure of the device. The contaminant particles, and corrosion can cause problems at later assembly operation such as wirebonding.

One approach to reducing corrosion during dicing, involves the use of high purity deionized water (DIW) as a coolant for the dicing blade. The cutting area and the rotating blade are ordinarily bathed in a significant flow of deionized water. One also would think that the silicon residue would be flushed away by the water coolant that floods the cutting area. Unfortunately, even under significant flooding, the small silicon particles are not completely flushed away. Worse, the water coolant can lead to a build up of static charge, resulting in accumulation of silicon residues/particles on the bonding pads, as well as contributing to corrosion.

As the semiconductor technology rapidly advances, wafer size is increased, while die size is reduced. This prolongs the time spent for dicing, which leads to more challenges.

BRIEF SUMMARY OF THE INVENTION

It is therefore an objective of the present invention to provide a dicing solution and a method to use the dicing solution, a solution for wafer dicing, that is effective in inhibiting adherence of the contamination residues/particles to all exposed surface areas and the corrosion of all exposed surface areas.

One embodiment of the present invention provides a dicing solution effective in inhibiting adherence of the contamination residues/particles to exposed metallization areas and the corrosion of the exposed metallization areas, comprising:
at least one dicarboxylic acid and/or salt thereof;
at least one hydroxycarboxylic acid and/or salt thereof or amine group containing acid;
a surfactant selected from the group consisting of
phosphate esters, branched alcohol ethoxylate based surfactant;
alkyldiphenyloxide disulfonic acid based surfactant having a structure of:

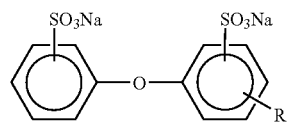

wherein R is an alkyl group having 10 to 12 carbon atoms;
dodecyl benzene sulfonic acid (DDBSA) based surfactant having a structure of:

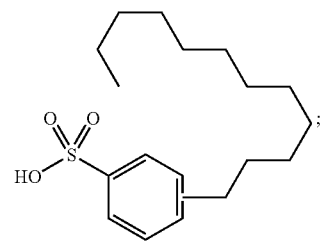

secondary alkyl sulfonic acid based surfactant having a structure of:

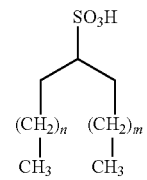

wherein $10<m+n<14$;
and the combinations thereof; and
the remainder being substantially deionized water;
wherein the dicing solution is fluoride-free and having a pH of about 1 to about 4.

Another embodiment of the present invention provides a method of wafer dicing, a wafer is diced by a saw with bonding pads, contamination residues/particles are produced by sawing the wafer, corrosion is potentially formed on all exposed metallization areas; comprising steps of:
contacting the wafer continuously with deionized water; and
contacting the wafer continuously with a dicing solution comprising
at least one dicarboxylic acid and/or salt thereof;
at least one hydroxycarboxylic acid and/or salt thereof or amine group containing acid;
a surfactant selected from the group consisting of
phosphate esters, branched alcohol ethoxylate based surfactant;
alkyldiphenyloxide disulfonic acid based surfactant having a structure of:

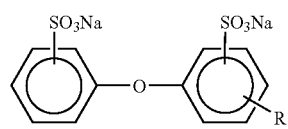

wherein R is an alkyl group having 10 to 12 carbon atoms;

dodecyl benzene sulfonic acid (DDBSA) based surfactant having a structure of:

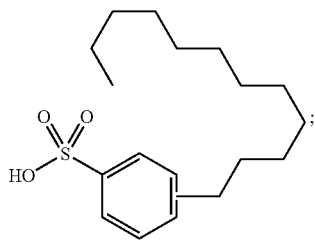

secondary alkyl sulfonic acid based surfactant having a structure of:

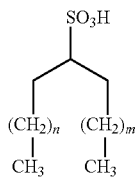

wherein 10<m+n<14;
and the combinations thereof; and
the remainder being substantially deionized water;
wherein the dicing solution is fluoride-free and having a pH of about 1 to about 4.

DETAILED DESCRIPTION OF THE INVENTION

Figure 1:
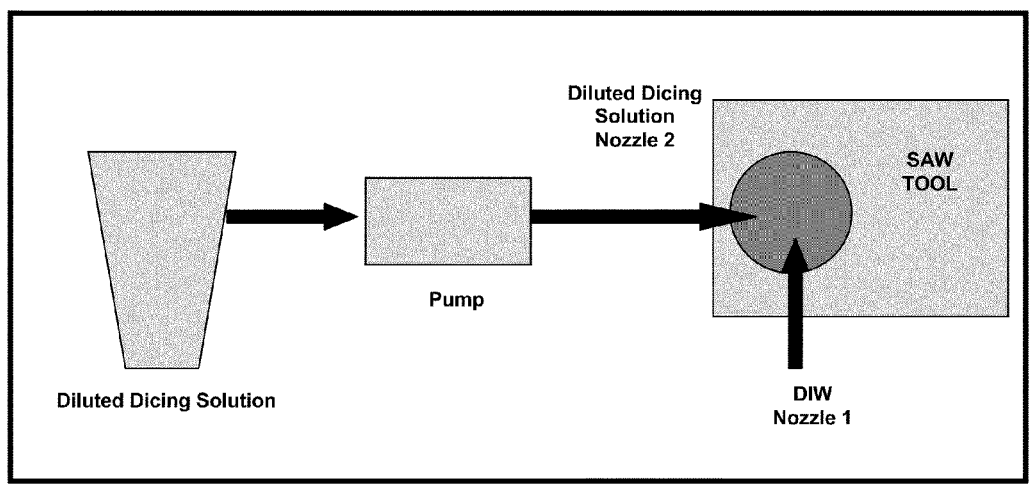
FIG. 1 is a schematic drawing of a typical apparatus for wafer dicing by sawing in the present invention.

FIG. 1 shows a typical apparatus for wafer dicing by sawing employed in the present invention. A NANOACE Saw tool with diamond-tip wheel at 60000 RPM, and a test saw recipe x/y dicing at about 30 minutes/wafer, are used, the feed rate is about 5 mm/s. The Wafers are 6" bare Si with stack: AlOx/Al/Thermal Ox/Si substrate. The deionized water (DI Water or DIW) is injected from Nozzle 1 onto the wafer (Al bond pad wafer or Cu bond pad wafer) at a flow rate about 2 lit/minute. The diluted dicing solution is injected from Nozzle 2 onto the wafer, sourced from external pump, at flow rate about 0.22 lit/minute. Temperature of DI Water and dicing solution on wafer surface is room Temperature (20° C. to 30° C.). DI water and dicing solution are injected continuously during sawing.

Wafers are scrubbed with sponge and DIW after sawing. They are then rinsed with DIW and spin dried with CDA in a spin rinse module, and finally went through a series inspections: visual (naked-eye), optical(with Microscopy), scanning electron microscope (SEM), Energy-Dispersive spectrum (EDS) and Ellipsometry measurements.

One dicing solution is a fluoride-free aqueous composition comprising a dicarboxylic acid and/or salt thereof; a hydroxycarboxylic acid and/or salt thereof or amine group containing acid; and a surfactant. In particular, the fluoride-free aqueous composition comprises about 0.005 to about 16% by weight of at least one dicarboxylic acid, salt thereof or mixture thereof, about 0.003 to about 4% by weight of at least one hydroxy carboxylic acid, salt thereof or mixture thereof; or an amine group-containing acid, and the remainder being substantially water, and having a pH of about 1 to about 4.

The dicing solution can further comprise a surfactant. The surfactant used in the dicing solution, is about 0.0004 to about 0.5% by weight, and is selected from the group consisting of phosphate esters branched alcohol ethoxylate based surfactant;

alkyldiphenyloxide disulfonic acid based surfactant having a structure of:

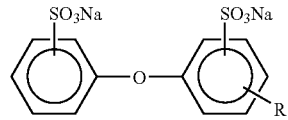

wherein R is an alkyl group having 10 to 12 carbon atoms;
dodecyl benzene sulfonic acid (DDBSA) based surfactant having a structure of:

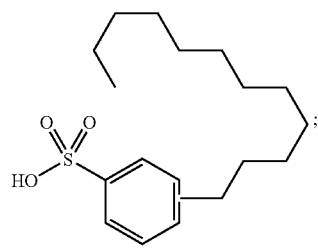

secondary alkyl sulfonic acid based surfactant having a structure of:

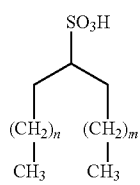

wherein 10<m+n<14;
and the combinations thereof.

An example of phosphate ester branched alcohol ethoxylate is polyoxyethylene tri-decyl ether phosphate Rhodafac® RS surfactants, such as Rhodafac® RS 710, commercially available from Rhodia HPCII; examples of alkyldiphenyloxide disulfonic acid based surfactants are DOWFAX surfactants, such as DOWFAX 2A1 and DOWFAX 3B2 (tradenames), commercially available from Dow Chemical; and Calfax® DBA surfactants, such as Calfax® DBA -70, commercially available from Pilot Chemical Company; an example of secondary alkyl sulfonic acid based surfactant is under the trade names Hostapur® SAS, such as Hostapur® SAS-10, commercially available from Clariant.

A number of different acids have been tested, and their effectiveness were observed. The dicarboxylic acid or salt thereof has two to six carbon atoms are more effective. The dicarboxylic acid is selected from the group consisting of oxalic acid, malonic acid, succinic acid, glutaric acid, adipic acid, maleic acid and fumaric acid. The dicarboxylic acid comprises a mixture of malonic acid and oxalic acid.

One example of the dicing solution comprises citric acid, malonic acid, oxalic acid and deionized water. A preferred concentration of the components is: 4.0% citric acid, 2.0% malonic acid, 4.0% oxalic acid and the remainder being substantially deionized water. Under this example, a dicing solution A comprises 4.0% citric acid, 2.0% malonic acid, 4.0% oxalic acid and the remainder being substantially deionized water.

A second dicing solution B comprises 4.0% citric acid citric acid, 2.0% malonic acid, 4.0% oxalic acid, 0.4% Hostapur® SAS and the remainder being substantially deionized water.

The dicing solutions can then be diluted with DI water by weight, at the process tool for convenience.

The wafer can be cleaned (pre-treatment) with a cleaning solution prior to saw. One example of the cleaning solution comprises N,N-dimethyl acetamide (DMAC), Ammonium Acetate, Acetic acid (glacial), Ammonia Fluoride ($NH_4F$) and the remainder being substantially deionized water.

WORKING EXAMPLES

All experiments had been carried out using the apparatus shown in FIG. 1. The dicing solution used in all experiments was dicing solution B comprising: 4.0% citric acid, 2.0% malonic acid, 4.0% oxalic acid, 0.4% Hostapur® SAS, and the remainder being substantially deionized water. In addition, A dicing solution was also used in Experiment 7. The cleaning solution used in the experiments comprising: N,N-dimethyl acetamide (DMAC), Ammonium Acetate, Acetic acid (glacial), Ammonia Fluoride ($NH_4F$) and the remainder being substantially deionized water. The dilution ratio shown in the following Tables was the weight of DI water to the dicing solution.

Example 1

During the dicing process electrostatic charge was accumulate on the wafer. This charge build-up and/or a subsequent electrostatic discharge (ESD) could damage sensitive devices on the wafers. Electrostatic charge could also attract particles to the wafer surface. Therefore it was important to dissipate any electrostatic charge build-up during the dicing process.

DI water is commonly used as a dicing fluid in order to provide lubrication between the saw blade and the wafer. DI water also acts as a coolant to prevent the saw blade from overheating due to friction between the saw blade and the wafer. However, DI water has a high resistivity (typically about 18 megaohms) so it is not a good conducting fluid for charge dissipation. A commonly used method to lower the resistivity of the DI water is by injecting $CO_2$ into the DI water. This lowers the resistivity of the DI water so the fluid is better at dissipating charge.

The method for dissipating the electrostatic charge in the present invention is using a dicing solution having a low resistivity (high conductivity). The conducting dicing solution provides a path for the charge to dissipate during dicing.

Figure 2:
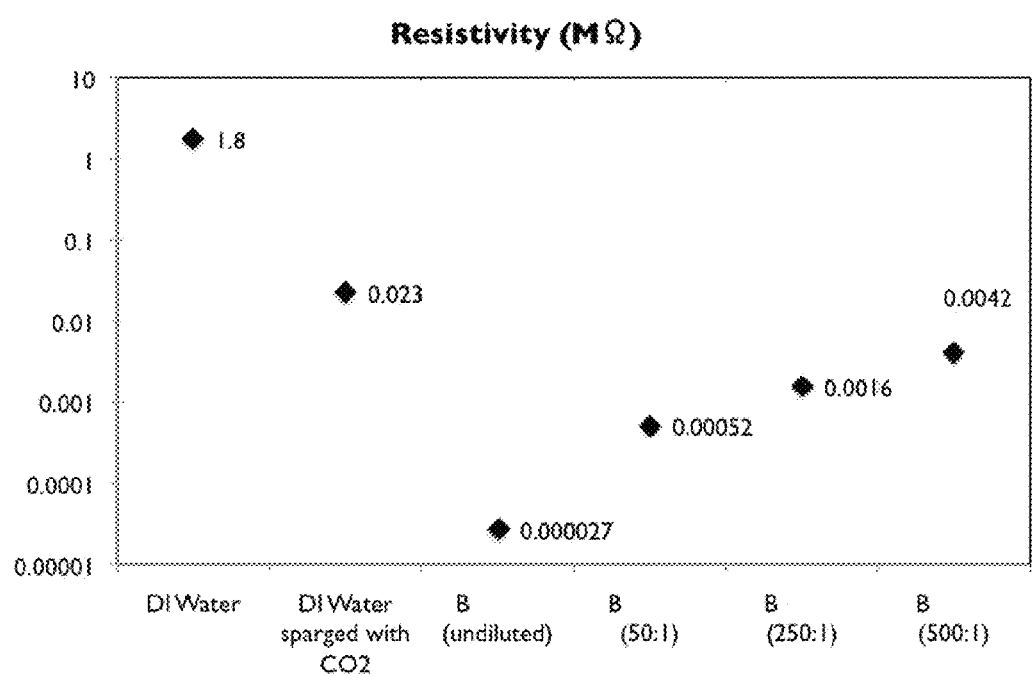
FIG. 2 shows the resistivity from DI water, DI water sparged with $CO_2$, and dicing solution B at various dilutions.

The resistivity had been measured for DI water, DI water sparged with $CO_2$, and dicing solution B and diluted dicing solution B. The date was shown in FIG. 2. As indicated in FIG. 2, dicing solution B diluted to 500:1 had a lower resistivity than even $CO_2$ sparged DI water. Therefore dicing solution B is better at dissipating charge build-up on the wafer during dicing.

During the dicing process, a dicing solution with lower surface tension wets the surface of the wafer better. Better wetting of the surface will improve particle removal.

The surface tension of dicing solution B diluted with DI water at various ratios were shown in Table I, in comparison with DI water which is 73 dynes/cm at 20° C. Data in Table II indicated that dicing solution B had better particle removal capabilities than DI water.

TABLE I

| Product Dilution | Surface Tension (dynes/cm) |
|---|---|
| B | 29.4 |
| B 2.5:1 | 30.8 |
| B 50:1 | 44.0 |
| B 250:1 | 65.6 |
| B 500:1 | 68.7 |

Figure 3:
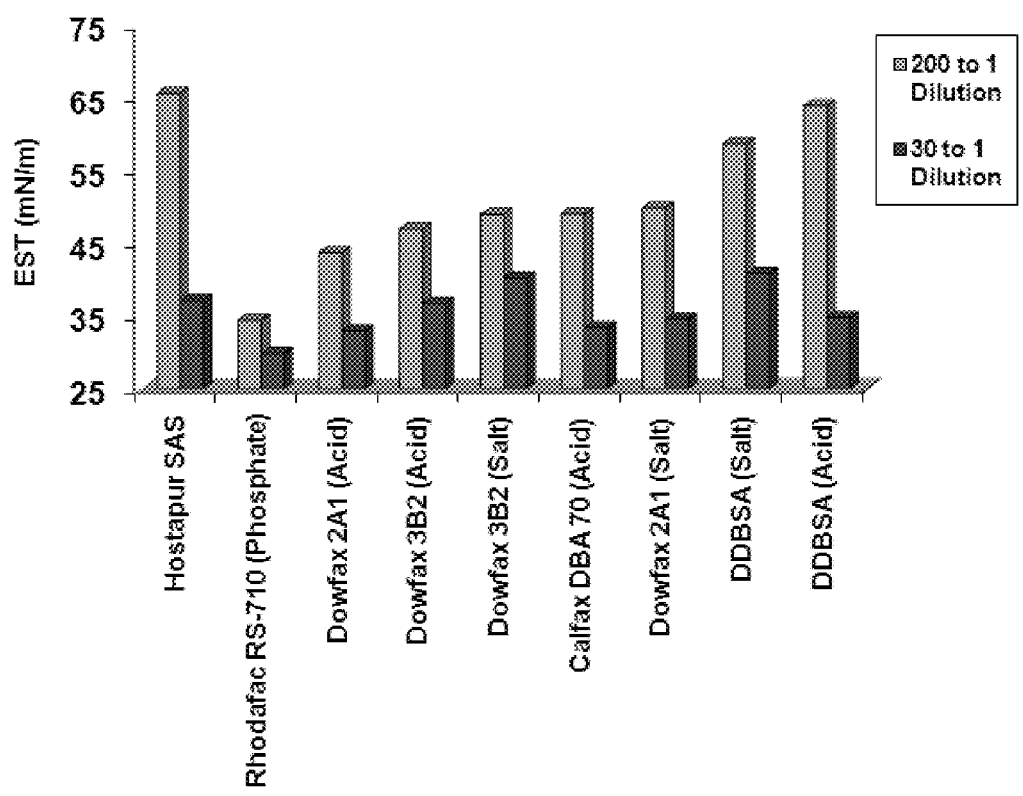
FIG. 3 shows the surface tensions from dicing solutions with different surfactants.

The surface tensions from dicing solutions with different surfactants were also measured and shown in FIG. 3. The dicing solutions comprised 4.0% citric acid, 2.0% malonic acid, 4.0% oxalic acid, 0.37% surfactant, and the remainder being substantially deionized water. The results showed that the surfactants tested all had lower surface tension. Therefore, they were expected to have better particle removal capabilities than DI water.

Even though a surfactant in the dicing solution will reduce the surface tension to provide better particle removal, there is one potential issue with a surfactant: foaming. Many surfactants will cause foam to occur in the dicing solution. The foam can interfere with the dicing solution's ability to remove particles. The foam itself can dry on the wafer and leave particles of its own. Therefore it is important that as little foam as possible be generated in the dicing solution.

In tests on actual dicing machines, dicing solution B generated only little foam at the point of use of the saw blade and wafer surface. Dicing solution B also generated only little foam than the competitor product in a recirculation tank.

Al bond pads are often exposed during the dicing process. Another issue with using DI water only as a dicing solution is that its pH is about 7 and at that pH Al corrosion will occur.

Typical times of 20-30 minutes can be required to dice a wafer. During that time the Al bond pads will be exposed to DI water which can cause Al corrosion. One method for preventing the Al corrosion in DI water is to inject $CO_2$ into the DI water. This lowers the pH of the DI water to about 4-4.5. At this pH Al corrosion will be minimized.

Figure 4:
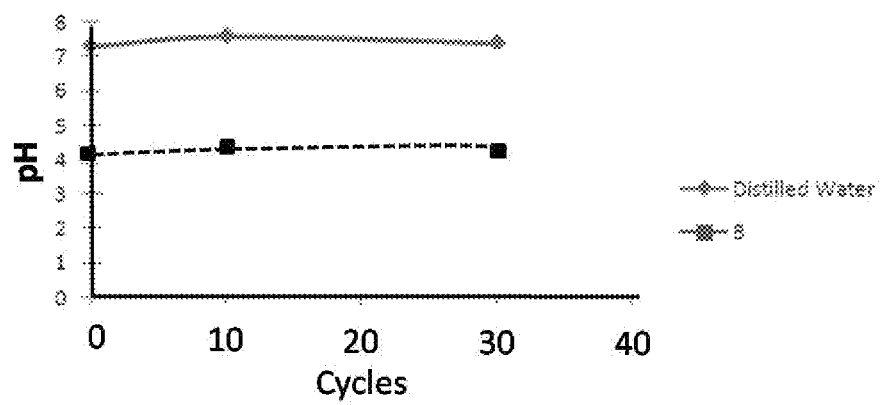
FIG. 4 shows the pH of dicing solution B at a dilution of 1000:1 as function of cycles.

The pH of dicing solution B at a dilution of 1000:1 (a typical dilution used for dicing) is 4. As shown in FIG. 4, the pH was constant over time in a recirculation system, about 30 cycles. Therefore dicing solution B will minimize Al corrosion and maintain that capability over time.

Example 2

The Wafers tested in this experiment were 6" bare Si with stack: AlOx/Al/Thermal Ox/Si substrate. The dicing solution B had been diluted with DI water resulting with different concentrations.

Visual data was shown in Table II. The results from visual observation indicated that using the DI water alone or with the cleaning solution for the pre-treatment was not effective to prevent the surface oxidation and the silicon residues/particles adhesion to the wafer surface. While the dicing solution used during wafer dicing by sawing, inhibited the formation of oxide layer, and prevented adhesion of the silicon residues/particles to the wafer surface.

TABLE II

| Wafer | Dicing Solution | Observations |
|---|---|---|
| 1 | DIW Only | Wafer appears cloudy during saw. In Dark Field - Dark grey surface; Grainy due to Si slurry, residues/particles |
| 2 | B 200:1 | Wafer appears less cloudy during saw. In Dark Field - Black surface; less grain & residues/particles. |
| 3 | B 100:1 | Wafer appears shiny during saw. In Dark Field - Black surface; lesser grain & residues/particles |

Example 3

The Wafers tested in this experiment were blanket wafers with: Al (0.5% Cu)/Thermal Oxide/Si; and Cu/Thermal Oxide/Si. The wafer dicing process by sawing was set up to last 30 minutes.

Figure 5:
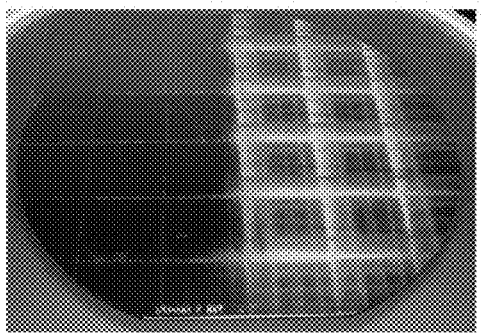
FIG. 5 is the optical picture from microscopy showing the cleaning effect on blanket Aluminum wafers without pre-treatments.
Figure 5:
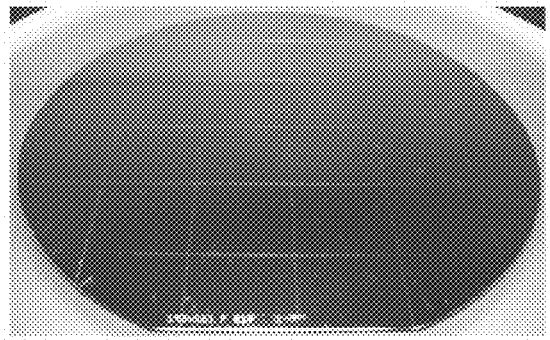

Optical picture from microscopy on blanket Aluminum wafers without pre-treatments, was shown in FIG. 5.

Figure 6:
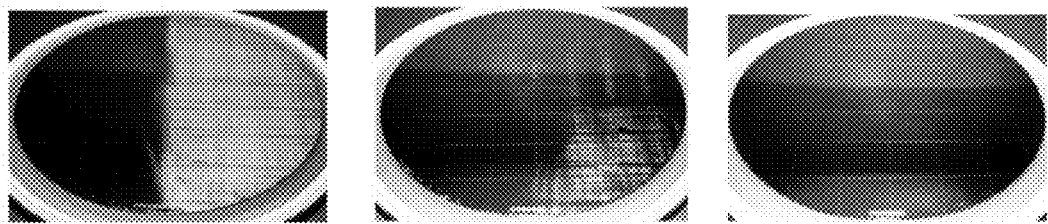
FIG. 6 is the optical picture from microscopy showing the cleaning effect on blanket Copper wafers without pre-treatments.

Optical picture from microscopy on blanket Copper wafers without pre-treatments, was shown in FIG. 6.

On wafers that were diced with DI water the Si particles were clearly visible on the wafers as the dark haze on the bond pads. The left half of the picture on the most left in FIG. 5 or FIG. 6, was scrubbed to clean the Si particles. Only the right side of the picture in FIG. 5 or FIG. 6 was not scrubbed. On wafers that were diced with dicing solution B (1000:1 dilution with DI water), there was no Si particles on the wafers, as the pictures did not have a dark haze on them. A commercial product, Keteca Diamaflow™ 688 CL (1000:1 dilution with DI water) was used as a reference shown as the middle picture of FIG. 6. As evidenced from the picture, Keteca Diamaflow™ 688 CL removed some of the Si particles. But dicing solution B performed much better.

Pre-treatment with a cleaning solution prior to saw was also tested. Visual data was summarized in Table III.

TABLE III

| Pre-Treatment | Dicing Solution | Observations |
|---|---|---|
| None | DI Water Only | Wafer looks cloudy; particles on surface need to be brushed off |
| Cleaning Solution | DI Water Only | Wafer looks cloudy; particles on surface need to be brushed off |
| None | B 100:1 | Wafer surface is shiny; no particles |
| None | B 200:1 | Wafer surface is shiny; no particles |

The results from visual observation in Table III indicated that using the DI water alone or with the cleaning solution for the pre-treatment was not effective to prevent the surface oxidation and the silicon residues/particles adhesion to the wafer surface. While, the dicing solution used during wafer dicing by sawing, inhibited the formation of oxide layer, and helped to prevent adhesion of the silicon residues/particles to the wafer surface.

Example 4

The Wafers tested in this experiment were patterned Al bond pad wafers. The Wafers were segments(not whole wafers), and ashed to remove photoresist. The wafer dicing process by sawing was set up to last 10 minutes.

Experiments were performed on the patterned Al bond pad wafers, using DI water and diluted dicing solution B, both with and without pre-treatment by the cleaning solution. Visual data was shown in Table IV.

Figure 7:
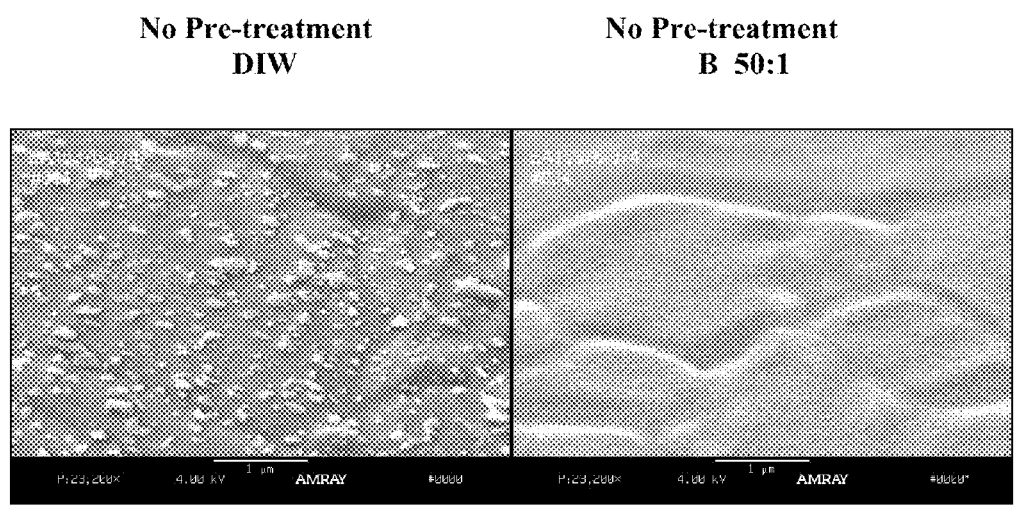
FIG. 7 is the scanning electron microscope (SEM) picture showing the cleaning effect on patterned Aluminum bonding pad wafers without pre-treatments.

The scanning electron microscope (SEM) picture on patterned Aluminum bonding pad wafers without pre-treatments, was shown in FIG. 7.

TABLE IV

| Pre-Treatment | Dicing Solution Dilution | Observations |
|---|---|---|
| None | DI Water Only | Bond pads near saw cut are discolored: Si particles from saw process |
| Cleaning Solution | DI Water Only | Bond pads near saw cut are discolored: Si particles from saw process |
| None | B 100:1 | Bond pads near saw are not discolored: no Si particles |
| Cleaning Solution | B 100:1 | Bond pads near saw are not discolored: no Si particles |

Higher magnification SEM picture clearly showed the Si particles remaining on the bond pads diced with DI water (the left picture in the figure). Most importantly, the high magnification SEM picture showed the Al surface was very clean with no Si particles diced with dicing solution B at a dilution of 50:1. This data showed the ability of dicing solution B to remove Si particles from Al wafers.

Example 5

During saw, a slurry was formed which consisting of DI water and wafer material (typically Si or whatever substrate materials). This slurry had an affinity to stick to the wafer. The wafer was covered with passivation which allowed the slurry to easily be washed away.

Unfortunately DI water is known to cause corrosion on the aluminum bond pads and would oxidize copper pads as well. In the case of aluminum, silicon and aluminum (and their oxides have a strong affinity for one another) "attach" on the pad which exacerbated the corrosion issues. When Al bond pad wafers reach the dicing process, the pads may have an oxidation and contamination layer on them due to previous process steps.

After dicing, the bond pads may go through a test/probe process to check the pads for electrical functionality. During testing a probe tip touches down on the pads. Ideally the contact resistance between the Al pad and the probe tip should be as low as possible. However, if the Al surface has a thick oxidation layer and/or a contamination layer on it the contact resistance may be high and cause the probe test to fail even though the pad may be a functional pad.

Problems due to a thick oxidation and/or contamination layer on an Al bond pad can also occur at wirebonding which is when a metal wire is being bonded to the Al pad. Again, if the Al pad has a thick oxidation/contamination layer the metal wire may not adhere well to the Al pad.

To prevent these "false fails" from happening, the bond pad can be cleaned to remove the oxidation and contamination layer so the Al surface is as clean as possible when the probe tip touches it. Therefore a process to clean the Al bond pad would be advantageous as well for wirebonding.

A cleaning process for the Al pads was performed by using a dual process which consists of a pre-treatment of the wafer with the cleaning solution followed by using dicing solution during the dicing process. The experimental condition was the same as in Example 4. The results of this dual process was shown in FIG. 8.

Figure 8:
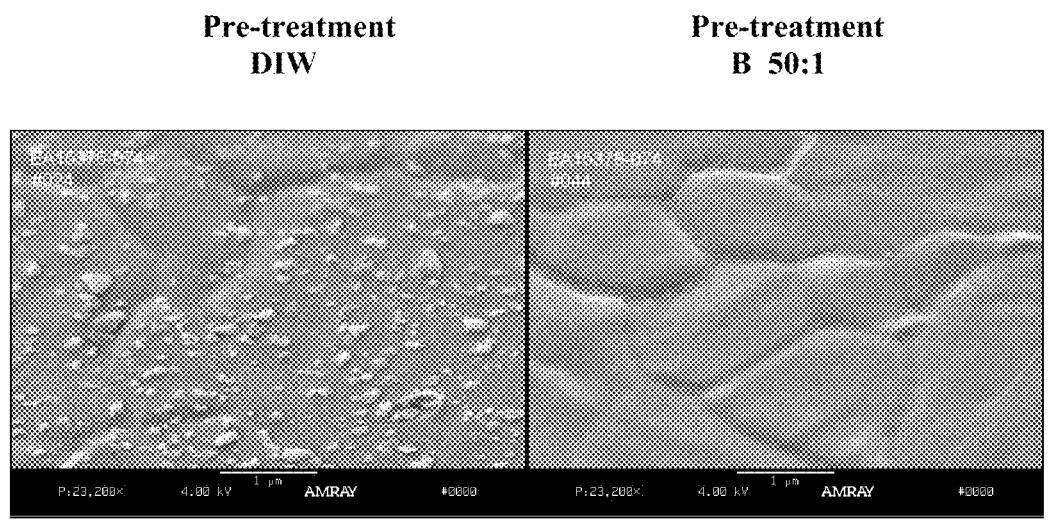
FIG. 8 is the scanning electron microscope (SEM) picture showing the cleaning effect on patterned Aluminum bonding pad wafers with pre-treatments.

The SEM picture of FIG. 8 showed Al bond pads that had been pre-treated with the cleaning solution and then diced with either DI water or dicing solution. On the pads that had been diced with dicing solution dicing solution B, the grain boundaries of the Al surface were very clear and visible. This indicated that the oxidation and/or contamination layers had been removed from the Al surface.

Further indication of the thinner oxidation layer after the dual process was evidenced by the X-ray Photoelectron Spectroscopy (XPS) data summarized in Table V. Here the thickness of the oxidation layer was measured. The data showed that when the dual process was used the oxidation layer was much thinner than without the dual process.

TABLE V

| Al Oxide Thickness (Å) | B | Pre-treatment followed by at Dicing |
|---|---|---|
| Before Dicing | >100 | >100 |
| After Dicing | 96 | 45 |

Figure 9:
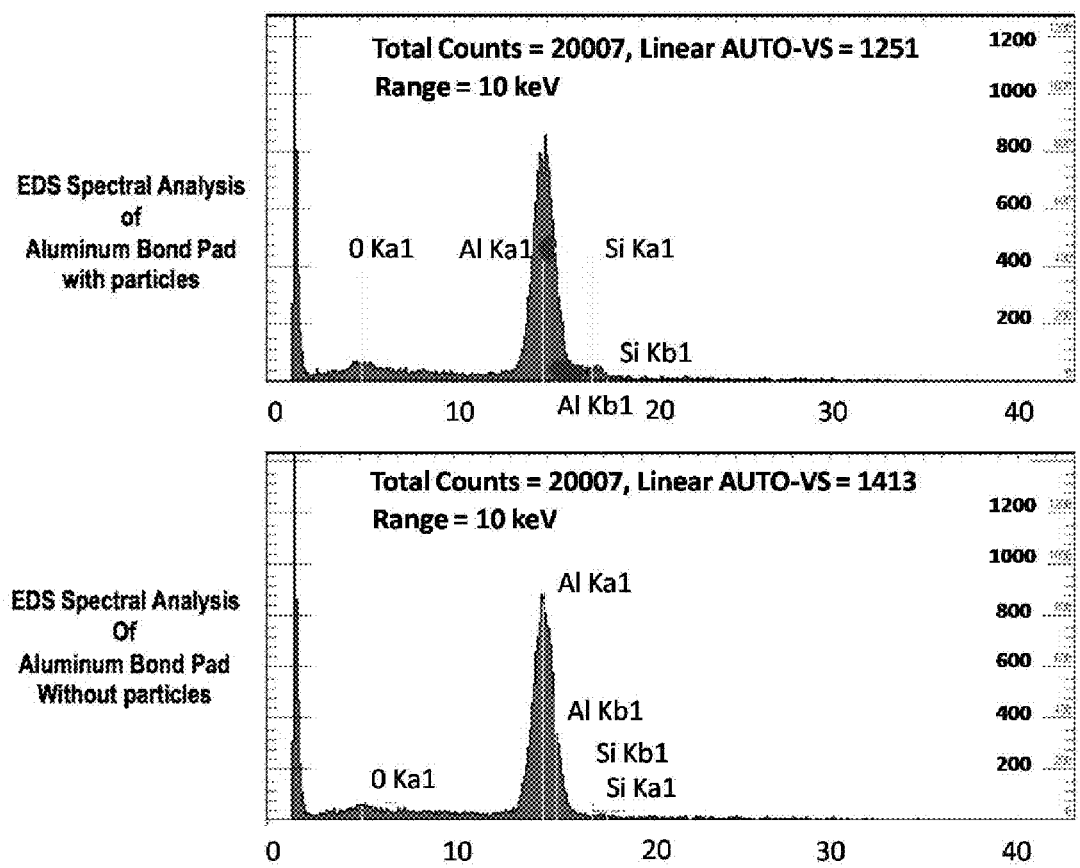
FIG. 9 is the Energy-Dispersive spectrum (EDS) showing the cleaning effect on patterned Aluminum bonding pad wafers with pre-treatments as shown in FIG. 8.

Energy-Dispersive spectrum (EDS) analysis was conducted using an Amray 3700 FE SEM with Kevex Sigma 2 EDS at 4 kV. Two samples tested: patterned Al bond pad wafers treated with the cleaning solution and DI water showing residues/particles (up curve in FIG. 9); and patterned Al bond pad wafers treated with the cleaning solution and the dicing solution B (dilution 100:1) showing no residues/particles(lower curve in FIG. 9).

As shown in the EDS spectra (FIG. 9), Al bonding pad with particles had the silicon peak ("SiKa1") higher than in the case of the bonding pads without particles. This peak corresponded to the Si-slurry on the pad.

For this experiment, the results from different inspection tools all indicated that using the DI water alone or with the cleaning solution for the pre-treatment was not effective to prevent the surface oxidation and the silicon residues/particles adhesion to the Al wafer surface. While the dicing solution B used during wafer dicing by sawing, inhibited the formation of oxide layer, and prevented adhesion of the silicon residues/particles to the Al wafer surface.

Example 6

The Wafers tested in this experiment were blanket wafers with Cu/Thermal Oxide/Si. The wafer dicing process by sawing was set up to last 10 minutes.

When wafers with exposed Cu surfaces (Cu bond pads or other Cu surfaces) reached the dicing process, the Cu surface might have an oxidation and contamination layer on it due to previous process steps. Copper Oxide film thickness was measured before the saw process, and also 4 days after the saw process with and without the dicing solution B. Due to this delay, there was an expected regrowth of copper oxide. Visual data was shown in Table VI.

TABLE VI

| Pre-Treatment | Dicing Solution Dilution | Observations |
|---|---|---|
| None | DI Water Only | Wafer looks cloudy; particles on surface need to be brushed off |
| Cleaning Solution | DI Water Only | Wafer looks cloudy; particles on surface need to be brushed off |
| None | B 100:1 | Wafer surface is shiny; no particles |
| None | B 200:1 | Wafer surface is shiny; no particles |
| None | B 600:1 | Wafer surface is shiny; no particles |

The Ellipsometry tests were carried out and shown in Table VII.

TABLE VII

| | | Cu Oxide Thickness (Å) | |
|---|---|---|---|
| Pre-Treatment | Dicing Solution Dilution | Before Saw | After Saw (Delay of 4 days) |
| None | DI Water Only | 42 | 45 |
| Cleaning Solution | DI Water Only | 35 | 43 |
| None | B 100:1 | 39 | 32 |
| None | B 200:1 | 39 | 28 |
| None | B 600:1 | 37 | 24 |

In the tests, Cu oxide thickness was measured on each wafer prior to saw. Measurements were done at 9 different locations on each wafer: 1 site at center; and 8 sites around edge. The wafers were then gone through wafer dicing process by sawing. The post-measurements were carried out four days later. There was copper oxide re-growth due to the delay. The following observations were made.

The Cu oxide thickness for the first wafer before saw was measured to be 42 Å. There was no cleaning solution used as the pre-treatment. DI water was injected to the wafer during the sawing process. 4 days after saw, the thickness was 45 Å. Effectively, DI water did not remove any Cu oxide.

The thickness for the second wafer before saw was measured to be 35 Å. Cleaning solution was used as the pre-treatment, and DI water was injected to the wafer during the sawing process. Cleaning solution had a functionality of removing copper oxide; however saw treatment with DI water re-grows the copper oxide that was removed with the cleaning solution. The thickness grown to 43 Å, from the initial 35 Å over 4 days.

The thickness for the third wafer before saw was measured to be 39 Å. There was no cleaning solution used as the pre-treatment. Diluted dicing solution (100:1) was used during the sawing process. The injection of the diluted dicing solution, removed copper oxide during saw process despite any copper oxide regrowth that may have happened. This was evident from the reduced thicknesses after 4 days (32 Å) compared to the pre-saw thickness of copper oxide.

The thickness for the fourth wafer before saw was measured to be 39 Å. There was no cleaning solution used as the pre-treatment. Diluted dicing solution (200:1) was used during the sawing process. The injection of the diluted dicing solution, removed copper oxide during saw process despite any copper oxide regrowth that may have happened. This was evident from the reduced thicknesses after 4 days (28 Å) compared to the pre-saw thickness of copper oxide.

The thickness for the fifth wafer before saw was measured to be 37 Å. There was no cleaning solution used as the pre-treatment. Diluted dicing solution (600:1) was used during the sawing process. The injection of the diluted dicing solution, removed copper oxide during saw process despite any copper oxide regrowth that may have happened. This was again evident from the reduced thicknesses after 4 days (24 Å) compared to the pre-saw thickness of copper oxide.

The results from different inspection tools all indicated that using the DI water alone or with the cleaning solution for the pre-treatment was not effective to prevent the surface oxidation and the silicon residues/particles adhesion to the Cu wafer surface. While the dicing solution used during wafer dicing by sawing, inhibited the formation of oxide layer, and prevented adhesion of the silicon residues/particles to the Cu wafer surface.

Example 7

The Wafers tested in this experiment were blanket wafers with: Al (0.5% Cu)/Thermal Oxide/Si. The wafer dicing process by sawing was set up to last 30 minutes.

Dicing solution A and dicing solution B were both used in this example. Both dicing solutions were diluted with DI water to 100:1.

Figure 10:
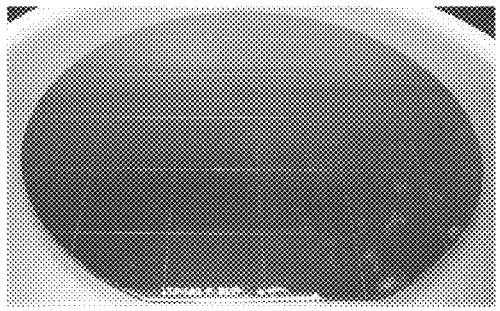
FIG. 10 is the optical picture from microscopy showing the cleaning effect on blanket Aluminum wafers using dicing solution A and dicing solution B, both at a dilution of 100:1.
Figure 10:

Optical pictures from microscopy on blanket Aluminum wafers using both dicing solutions, were shown in FIG. 10.

On wafer that was diced with dicing solution A (picture on the left in FIG. 10), faint residues/particles were shown in the picture. Again, dicing solution B performed much better since no visible residues/particles were shown in the picture (picture on the right in FIG. 10). The data showed that the surfactant in combination with other components enhances the cleaning function of the dicing solution.

In conclusion, the working examples listed above have shown that using DI water along or with cleaning solution as pre-treatment still left Si residues/particles adhering to the wafer and bonding pad surfaces, also left exposed surfaces oxidized. Therefore, using DI water along or with cleaning solution was not effective to prevent the surface oxidation and the silicon residues/particles adhesion to the surfaces. The use of dicing solution along or with the cleaning solution for pre-treatment, during wafer dicing by sawing, was very effective to prevent the surface oxidation and remove the silicon residues/particles adhesion to the surface. The effect was shown even when the dicing solution was diluted 1000 times.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:
1. An apparatus for wafer dicing comprising:
a wafer containing plurality of integrated circuits;
a dicing saw; and
a dicing solution for wafer dicing consisting essentially of:
at least one dicarboxylic acid and/or salt thereof;
at least one hydroxycarboxylic acid and/or salt thereof or amine group containing acid;
a surfactant selected from the group consisting of phosphate esters branched alcohol ethoxylate based surfactant;
alkyldiphenyloxide disulfonic acid based surfactant having a structure of:

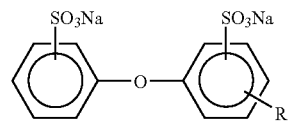

wherein R is an alkyl group having 10 to 12 carbon atoms;
dodecyl benzene sulfonic acid (DDBSA) based surfactant having a structure of:

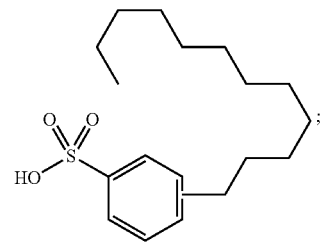

secondary alkyl sulfonic acid based surfactant having a structure of:

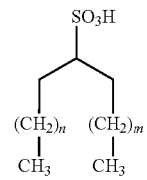

wherein 10<m+n<14;
and combinations thereof; and
the remainder being substantially deionized water;

wherein the dicing solution is fluoride-free and having a pH of about 1 to about 4; and the dicing solution is effective in inhibiting adherence of the contamination residues to exposed metallization areas and the corrosion of the exposed metallization areas.

2. The apparatus of claim 1, wherein the at least one dicarboxylic acid, salt thereof is about 0.005 to about 16% by weight;

the at least one hydroxy carboxylic acid, salt thereof is about 0.003 to about 4% by weight;

the surfactant is about 0.0001 to about 0.5% by weight; and the remainder being substantially deionized water.

3. The apparatus of claim 2, wherein the dicarboxylic acid is selected from the group consisting of oxalic acid, malonic acid, succinic acid, glutaric acid, adipic acid, maleic acid and fumaric acid.

4. The apparatus of claim 2, wherein the dicarboxylic acid comprises a mixture of malonic acid and oxalic acid.

5. The apparatus of claim 2 comprises citric acid, malonic acid, oxalic acid and deionized water.

6. The apparatus of claim 1 comprises 4.0% citric acid, 2.0% malonic acid, 4.0% oxalic acid, 0.4% of the surfactant, and the remainder being substantially deionized water.

7. The apparatus of claim 6, wherein the surfactant is a secondary alkyl sulfonic acid based surfactant having a structure of:

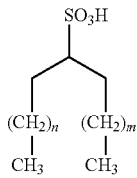

wherein $10<m+n<14$.

8. A An apparatus for wafer dicing comprising:

a wafer containing plurality of integrated circuits;

a dicing saw; and a dicing solution (a solution for wafer dicing) consisting essentially of:

4.0% citric acid;

2.0% malonic acid;

4.0% oxalic acid;

0.4% of a surfactant selected from the group consisting of phosphate esters branched alcohol ethoxylate based surfactant;

alkyldiphenyloxide disulfonic acid based surfactant having a structure of:

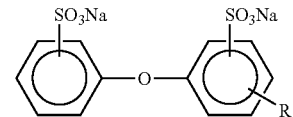

wherein R is an alkyl group having 10 to 12 carbon atoms;

dodecyl benzene sulfonic acid (DDBSA) based surfactant having a structure of:

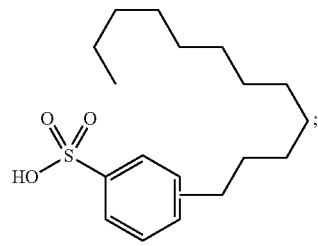

secondary alkyl sulfonic acid based surfactant having a structure of:

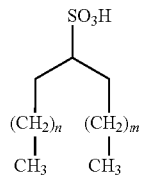

wherein $10<m+n<14$;

and combinations thereof; and the remainder being substantially deionized water;

wherein the dicing solution having a pH of about 1 to about 4; and the dicing solution is effective in inhibiting adherence of contamination residues to exposed metallization areas and effective in inhibiting corrosion of the exposed metallization areas.

9. apparatus of claim 8, wherein the surfactant is a secondary alkyl sulfonic acid based surfactant having a structure of:

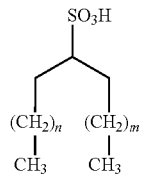

wherein $10<m+n<14$.

* * * * *